United States Patent [19]

Kofol

[11] 4,016,506
[45] Apr. 5, 1977

[54] DIELECTRIC WAVEGUIDE OSCILLATOR

[75] Inventor: J. Stephen Kofol, Roseville, Minn.

[73] Assignee: Honeywell Inc., Minneapolis, Minn.

[22] Filed: Dec. 24, 1975

[21] Appl. No.: 644,245

[52] U.S. Cl. .................................. 331/96; 330/56; 331/99; 331/107 R; 331/107 G; 333/82 R; 333/84 M

[51] Int. Cl.[2] .................. H03B 7/14; H03B 9/12

[58] Field of Search ............. 331/96, 99, 100, 101, 331/102, 107 R, 107 G, 117 D; 333/82 R, 84 M; 330/53–56

[56] References Cited

UNITED STATES PATENTS

| | | | |
|---|---|---|---|
| 3,516,021 | 6/1970 | Kohn | 331/117 D |
| 3,526,844 | 9/1970 | Bartelink et al. | 330/5 |
| 3,668,551 | 6/1972 | Kondo | 331/96 |
| 3,680,002 | 7/1972 | Quine | 331/96 |
| 3,683,298 | 8/1972 | Kawamoto | 331/107 R |
| 3,691,481 | 9/1972 | Kataoka et al. | 331/107 G |
| 3,701,049 | 10/1972 | Van Iperen et al. | 331/107 R |
| 3,721,919 | 3/1973 | Grace | 331/96 |
| 3,787,782 | 1/1974 | Tjassens | 331/107 R |
| 3,796,964 | 3/1974 | Baynham | 330/5 |
| 3,843,937 | 10/1974 | Hayashi et al. | 331/101 |
| 3,866,143 | 2/1975 | Jacobs et al. | 331/107 R |
| 3,903,488 | 9/1975 | Fong | 333/84 M X |

Primary Examiner—Siegfried H. Grimm
Attorney, Agent, or Firm—David R. Fairbairn

[57] ABSTRACT

A dielectric waveguide oscillator includes a microwave producing diode, a strip resonator, and a dielectric waveguide butted against one end of the strip resonator.

20 Claims, 6 Drawing Figures

FIG. 3
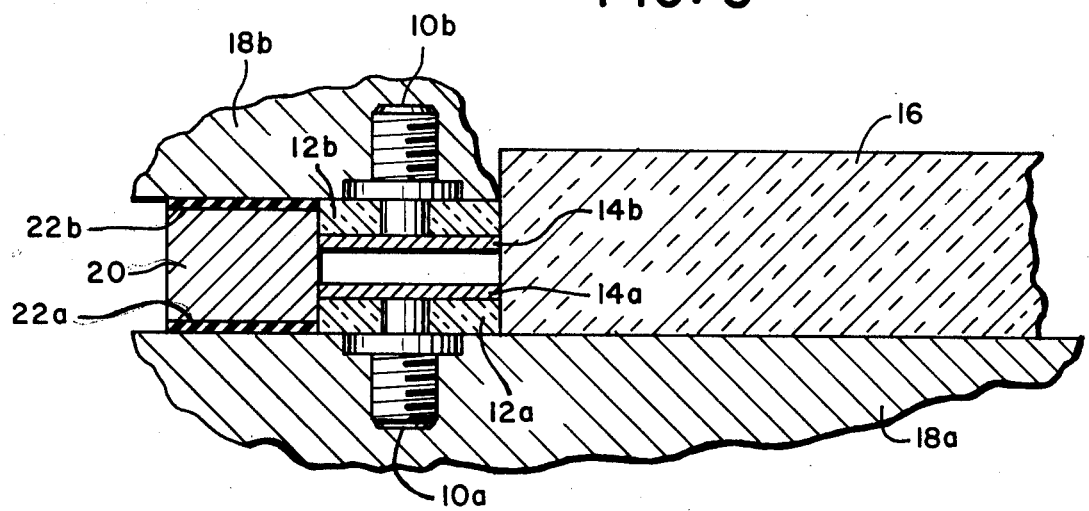
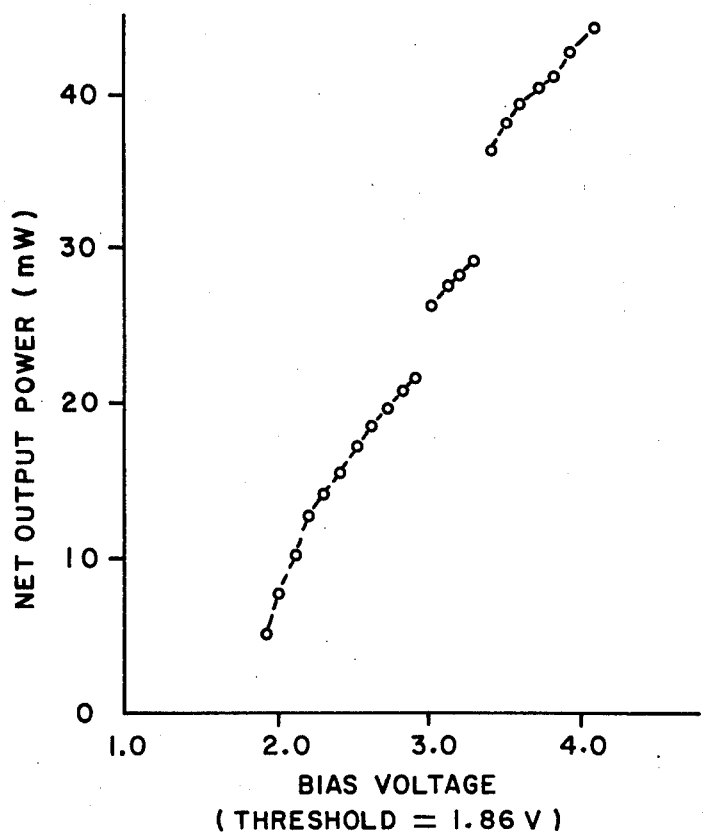
FIG. 5

DIELECTRIC WAVEGUIDE OSCILLATOR

BACKGROUND OF THE INVENTION

The present invention relates to microwave devices. In particular, the present invention relates to dielectric waveguide circuitry for use in microwave systems.

Dielectric waveguide circuitry has application as a type of low loss, low cost, integrated circuitry for electromagnetic radiation from millimeter wavelengths through the ultraviolet wavelengths. Dielectric waveguides are compact, light weight, and have potential for inexpensive manufacture in batch processes.

SUMMARY OF THE INVENTION

The present invention is a microwave device including a microwave producing means, a strip resonator, or quasi-TEM resonator means, and dielectric waveguide means. Microwave energy produced in the microwave producing means is coupled to the dielectric waveguide means by the resonator. One end of the resonator is substantially in contact with one end of the dielectric waveguide.

BRIEF DESCRIPTION OF THE DRAWINGS

FIG. 3 shows a cross-sectional view of another embodiment of the present invention.

FIG. 5 shows net output power as a function of bias voltage for one embodiment of the present invention.

DETAILED DESCRIPTION OF THE PREFERRED EMBODIMENTS

Figure 1:
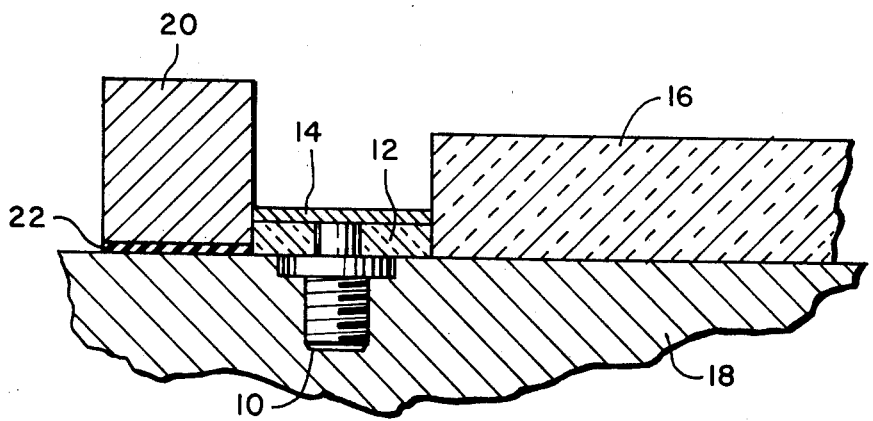
FIGS. 1 and 2 show a cross-sectional and perspective view, respectively, of one embodiment of the dielectric waveguide oscillator of the present invention.
Figure 2:
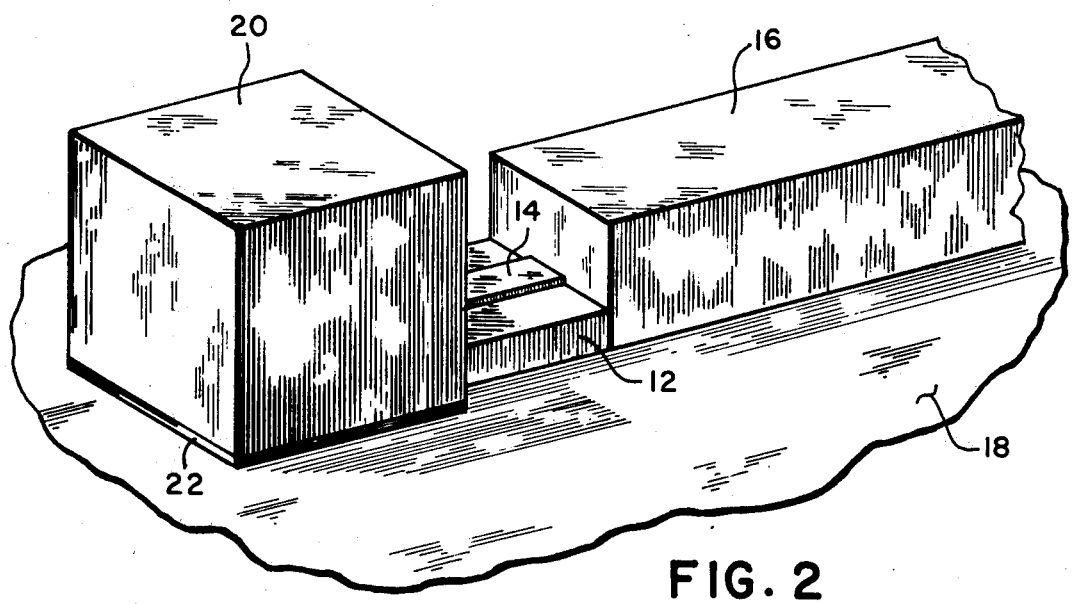

FIGS. 1 and 2 show one embodiment of the dielectric waveguide oscillator of the present invention. The device shown in FIG. 1 includes a microwave producing device 10, a resonator formed by dielectric body 12 and metal strip 14, dielectric waveguide 16, ground plane 18, shorting block 20, and insulating layer 22.

The microwave producing device 10 is preferably a semiconductor device such as a Gunn diode. Other microwave producing semiconductor devices, however, may also be used. Microwave producing device 10 is mounted in conductive ground plane 18 and extends into the resonator formed by dielectric body 12 and metal strip 14. As shown in FIG. 1, microwave producing device 10 has one electrode electrically connected to conductive ground plane 18, and another electrode in electrical contact with metal strip 14.

Dielectric body 12 and metal strip 14 form a strip resonator of the "microstrip" type. The microstrip resonator operates in the quasi-TEM mode. Other forms of resonators, however, can also be used. For example, other forms of strip resonators such as stripline devices may be used. Further description of the fabrication and design of microstrip and stripline devices can be found in the following references:

H. Sobol, "Applications of Integrated Circuit Technology to Microwave Frequencies", IEEE Proc., page 1200 (August, 1971), S. Mao, "Millimeter-Wave Integrated Circuits", IEEE Transactions on Microwave Theory and Techniques, MTT-16, 455 (July, 1968), B. Easter et al, "Microstrip Bandpass Filters With Reduced Radiation Effects", Electronics Letters, 9, 93 (Feb. 22, 1973), and B. Glance et al, "Low Noise, Integrated, Millimeter Wave Receiver", Bell System Technical Journal, 53, 1321 (September, 1974).

In the preferred embodiments of the present invention, the strip resonator has a length of approximately $\lambda/2$, where $\lambda$ is the wavelength of the microwaves produced. One end of the strip resonator is in contact with dielectric waveguide 16, and the opposite end is in contact with metal shorting block 20. Microwave producing device 10 is preferably mounted approximately midway between the two ends of the strip resonator, so that the distance from the microwave producing device 10 to either end of the strip resonator is approximately $\lambda/4$. In the preferred embodiments shown in FIGS. 1 and 2, microwave producing device 10 extends into the strip resonator through a hole which is provided in the strip resonator.

The strip resonator is the primary frequency determining element of the oscillator. This is achieved by providing a proper reactance match between the resonator and the microwave producing device 10 at the desired operating frequency. In addition, the strip resonator must have the proper quality factor Q, which is primarily determined by the amount of reflection at the strip resonator — dielectric waveguide interface.

Dielectric waveguide 16 is mounted on conductive ground plane 18 and is in contact with one end of the strip resonator formed by dielectric body 12 and metal strip 14. Microwave energy produced by the microwave producing device 10 is coupled into dielectric waveguide 16 at the strip resonator — dielectric waveguide interface. Further description of dielectric waveguides and their operation may be found in R. M. Knox et al, "Integrated Circuits for the Millimeter Through Optical Frequency Range", Microwave Research Institute Symposium Series, Proc. of the Symposium on Submillimeter Waves, 20, 497 (1970).

When the distance from the microwave producing device to each end of the strip resonator is approximately $\lambda/4$, it is desirable to present an AC short circuit at the end of the strip resonator opposite the end which is in contact with dielectric waveguide 16. Shorting block 20 and insulating layer 22 provide this AC short circuit at the desired operating frequencies of the oscillator. Insulating layer 22, however, provides Dc isolation between shorting block 20 and ground plane 18. This allows a DC bias to be applied to microwave producing device 10 by applying a DC bias between ground plane 18 and shorting block 20. Shorting block 20 is in electrical contact with metal strip 14, which, in turn, is in contact with one electrode of microwave producing device 10. Ground plane 18 is in electrical contact with another electrode of microwave producing device 10.

In operation, input power is applied to microwave producing device 10 by means of a DC voltage between shorting block 20 and ground plane 18. The microwave producing device 10 generates microwave energy. The particular wavelengths which are coupled into dielectric waveguide 16 are determined primarily by the strip resonator formed by dielectric body 12 and metal strip 14. That portion of the microwave energy which is coupled from dielectric body 12 into dielectric waveguide 16 propagates through dielectric waveguide 16 away from the microwave producing device.

The waveguide oscillator of the present invention has many advantages. When compared to a standard metallic waveguide, the dielectric waveguide oscillator of the present invention has lower cost, size, and weight, and has flexibility in design which is not possible with metallic waveguides. Another important advantage is that the microwave producing device and its resonator can be fabricated as a small independent circuit element. This unit can then be used with dielectric waveguides having a very wide variety of cross-section and dielectric constants. Practical sizes for the microwave producing device and resonator are on the order of 0.1 $cm^3$.

FIG. 3 shows another embodiment of the invention which is generally similar to the embodiment shown in FIGS. 1 and 2. Similar numbers are used to designate similar elements.

In the embodiment shown in FIG. 3, two microwave producing devices 10a and 10b are used. Each has its own strip resonator. The advantage of the arrangement shown in FIG. 3 is that the two microwave producing devices 10a and 10b can be phase locked to double the output power of the oscillator.

Figure 4:
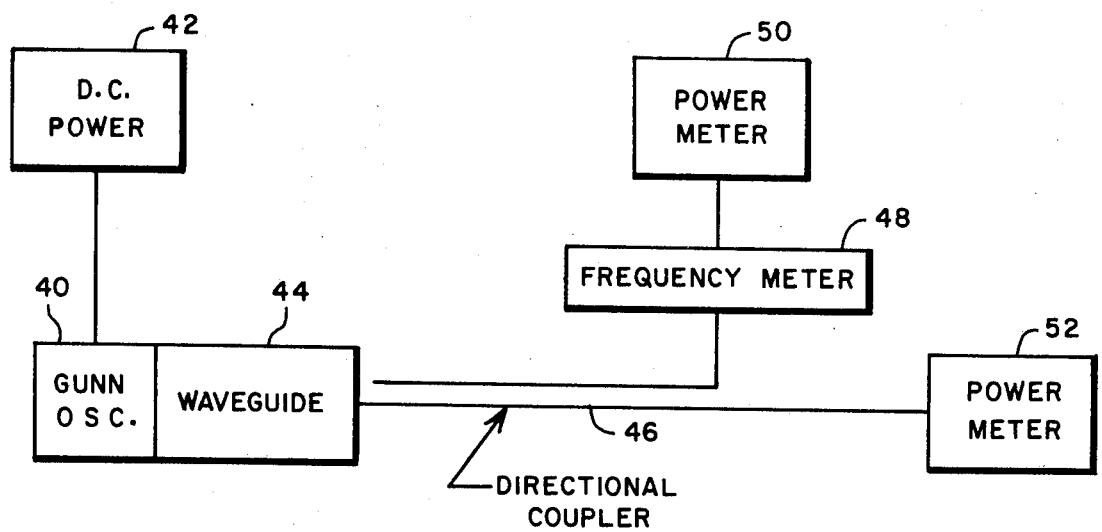
FIG. 4 shows a block diagram of test apparatus used to test the operation of one embodiment of the present invention.

FIG. 4 shows a block diagram of test apparatus which was used to test one successful embodiment of the present invention. The oscillator used a Gunn diode as the microwave producing device and is, therefore, designated as Gunn oscillator 40 in FIG. 4. The oscillator 40 was generally similar to the device shown in FIGS. 1 and 2, and includes all of the elements shown in FIGS. 1 and 2.

The test apparatus of FIG. 4 included a DC power source 42, a conventional rectangular waveguide 44, a directional coupler 46, frequency meter 48, and power meters 50 and 52. DC power source 42 supplied DC power to the Gunn oscillator 40. Rectangular waveguide 44 received microwave energy from the dielectric waveguide of Gunn oscillator 40. Directional coupler 46 received the microwave energy from waveguide 44 and directed that microwave energy to power meter 52 and to frequency measurement apparatus formed by frequency meter 48 and power meter 50.

The Gunn oscillator 40 described in FIG. 4 operated in the $K_a$ band. Microwave producing device 10 was a Varian axial Gunn diode (Model VSA-9210S2). The Gunn diode was heat-sink mounted into a brass carrier plate which formed conductive ground plane 18. The anode of the diode protruded into a small 0.035 inch hole which had been drilled through the strip resonator. The resonator was approximately λ/2 (0.069 inch) in length with the diode mounted approximately at the center (0.036 inch from the resonator — dielectric waveguide interface). The height of the resonator was only 0.018 inch in order to suppress any vertical resonances which could otherwise exist. The width of the resonator was 0.018 inch, which matched the width of dielectric waveguide 16.

Dielectric waveguide 16 was fabricated using semi-insulating chrome doped gallium arsenide. The width of dielectric waveguide 16 was 0.108 inch, and the height was 0.054 inch. Dielectric waveguide 16 had one end in contact with the resonator and the opposite end inserted in a conventional rectangular hollow metal waveguide. The end of dielectric waveguide 16 which was inserted in the hollow rectangular waveguide had a gradually tapered transition so as to enhance the transfer of microwave energy from the dielectric waveguide 16 to the rectangular waveguide.

As shown in FIGS. 1 and 2, one end of the resonator was AC shorted with metal shorting block 20. Shorting block 20 was DC isolated from ground and the diode bias was provided via the shorting block and metal strip 14. Metal strip 14 has a width of about 0.022 inch and an impedance of about 50 ohms. The distance between shorting block 20 and Gunn diode 10 was approximately λ/4. The section of the resonator between the Gunn diode 10 and the shorting block 20, therefore, appeared as an AC open circuit to Gunn doide 10.

The distance between Gunn diode 10 and dielectric waveguide 16 was also approximately λ/4. The resonator was terminated in an equivalent impedance of about 500 ohms at the end of the resonator where coupling to the dielectric waveguide 16 occurred. This impedance was reflected back to the diode resulting in an AC load impedance of about 5 ohms.

Figure 6:
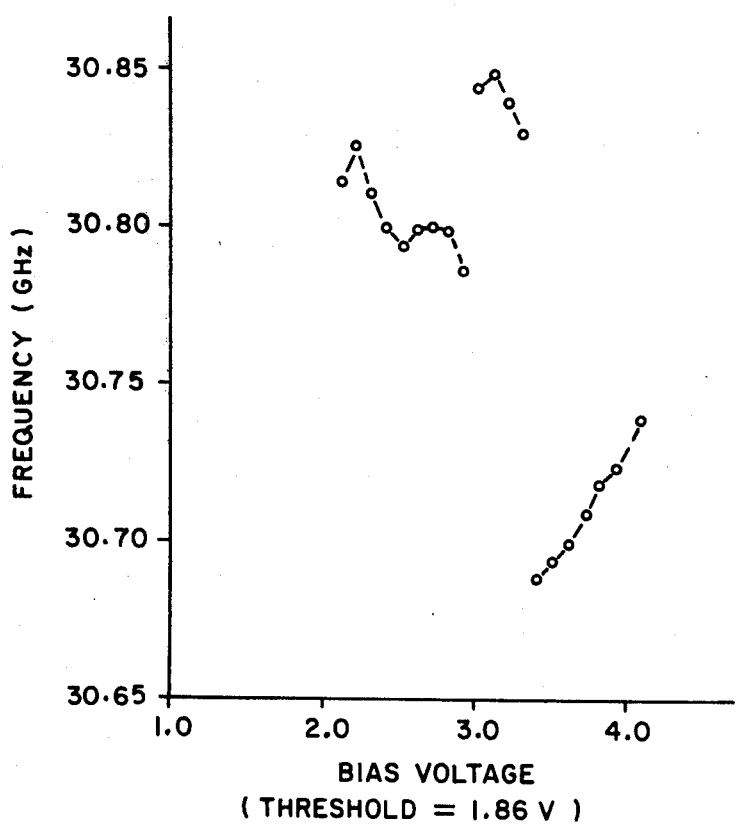
FIG. 6 shows frequency as a function of bias voltage for one embodiment of the present invention.

FIGS. 5 and 6 show net output power and frequency as a function of bias voltage as measured by the system of FIG. 4. The oscillator exhibited circuit efficiencies greater than 2.2 percent at about 31 GHz. These efficiencies are comparable to standard waveguide circuits.

In conclusion, the dielectric waveguide oscillator of the present invention features inexpensive construction, extremely small size, and efficiencies comparable to standard waveguide circuits. The oscillator can use commercially available microwave producing diodes and can be used with dielectric waveguides having a very wide variety of cross-sections and dielectric constants.

Although the present invention has been described with reference to a series of preferred embodiments, workers skilled in the art will recognize that changes may be made in form and detail without departing from the spirit and scope of the present invention.

The embodiments of the invention in which an exclusive property or right is claimed are defined as follows:

1. A microwave device comprising:
   microwave producing means;
   strip resonator means electrically connected to the microwave producing means and having first and second ends and wherein the strip resonator means has a length of approximately λ/2, wherein λ is the wavelength of microwaves produced by the microwave producing means; and
   dielectric waveguide means having one end substantially in contact with the first end of the strip resonator means.

2. The microwave device of claim 1 wherein the microwave producing means is positioned approximately midway between the first and second ends of the strip resonator means.

3. The microwave device of claim 2 and further comprising:
   shorting means for providing an AC short circuit at the second end of the strip resonator means.

4. The microwave device of claim 3 wherein the shorting means provides a DC open circuit at the second end of the strip resonator means.

5. A microwave device comprising:
   microwave producing means for producing microwave energy;
   quasi-TEM resonator means having first and second ends, the quasi-TEM resonator means adapted to receive microwave energy from the microwave producing means; and dielectric waveguide means having one end substantially in contact with the first end of the quasi-TEM resonator means for receiving microwave energy from the quasi-TEM resonator means.

6. The microwave device of claim 5 wherein the quasi-TEM resonator means primarily determines the frequency of the microwave energy.

7. The microwave device of claim 5 wherein the microwave producing means comprises a microwave producing diode.

8. The microwave device of claim 5 wherein the quasi-TEM resonator means comprises a strip resonator.

9. A microwave device comprising:

microwave producing means;

strip resonator means electrically connected to the microwave producing means and having first and second ends;

a conductive ground plane in contact with the microwave producing means and the strip resonator means; and dielectric waveguide means having one end substantially in contact with the first end of the strip resonator means.

10. The microwave device of claim 9 wherein the strip resonator means comprises:

a dielectric body having first and second ends and first and second opposite surfaces, the first surface being in contact with the conductive ground plane; and a metal strip on the second surface.

11. The microwave device of claim 10 wherein the microwave producing means has a first electrode in electrical contact with the conductive ground plane and a second electrode in contact with the metal strip.

12. The microwave device of claim 11 wherein the microwave producing means comprises a microwave producing diode.

13. The microwave device of claim 12 wherein the microwave producing means comprises a Gunn diode.

14. The microwave device of claim 11 wherein the strip resonator means has a length of approximately $\lambda/2$, wherein $\lambda$ is the wavelength of microwaves produced by the microwave producing means.

15. The microwave device of claim 14 wherein the microwave producing means is positioned approximately midway between the first and second ends of the strip resonator means.

16. The microwave device of claim 14 and further comprising:

shorting means for providing an AC short circuit at the second end of the strip resonator means.

17. The microwave device of claim 16 wherein the shorting means provide a DC open circuit at the second end of the strip resonator means.

18. The microwave device of claim 17 wherein the shorting means comprises:

a metal shorting block in electrical contact with the metal strip; and an insulating layer interposed between the metal shorting block and the conductive ground plane.

19. A microwave device comprising:

first and second microwave producing diodes;

first and second strip resonators electrically connected to the first and second microwave producing diodes, respectively, the first and second strip resonators each having first and second ends; and dielectric waveguide means having one end substantially in contact with the first ends of the first and second strip resonators.

20. A microwave device comprising:

microwave producing means;

strip resonator means electrically connected to the microwave producing means and having first and second ends, a first cross-section and a first dielectric constant; and dielectric waveguide means having one end substantially in contact with the first end of the strip resonator means, the dielectric waveguide means having a second cross-section and a second dielectric constant, wherein the second cross-section, the second dielectric constant, or both, differ from the first cross-section and the first dielectric constant.

* * * * *